United States Patent
Qi et al.

(10) Patent No.: US 9,306,572 B2
(45) Date of Patent: Apr. 5, 2016

(54) OUTPUT BUFFER, GATE ELECTRODE DRIVING CIRCUIT AND METHOD FOR CONTROLLING THE SAME

(71) Applicants: BOE TECHNOLOGY GROUP CO., LTD., Beijing (CN); Chengdu BOE Optoelectronics Technology Co., Ltd., Chengdu (CN)

(72) Inventors: Xiaojing Qi, Beijing (CN); Like Hu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 14/331,836

(22) Filed: Jul. 15, 2014

(65) Prior Publication Data

US 2015/0303925 A1 Oct. 22, 2015

(30) Foreign Application Priority Data

Apr. 18, 2014 (CN) .......................... 2014 1 0158958

(51) Int. Cl.
*H03K 19/0175* (2006.01)
*H03K 19/094* (2006.01)
*H03K 19/0948* (2006.01)

(52) U.S. Cl.
CPC ....... *H03K 19/0948* (2013.01); *H03K 19/09429* (2013.01)

(58) Field of Classification Search
CPC ............ H03K 19/0175; H03K 19/094; H03K 19/01707; H03K 19/01721; H03K 19/0948; H03K 19/09429
USPC ........................ 326/87, 83, 86, 68, 93, 95, 96
See application file for complete search history.

(56) References Cited

U.S. PATENT DOCUMENTS

| | | | | |
|---|---|---|---|---|
| 5,341,338 | A * | 8/1994 | Hashiguchi et al. | 365/206 |
| 5,825,215 | A * | 10/1998 | Sugio et al. | 327/108 |
| 6,469,565 | B1 * | 10/2002 | Lee | 327/374 |
| 2002/0180483 | A1 * | 12/2002 | Lim et al. | 326/83 |
| 2003/0080780 | A1 * | 5/2003 | Okamoto et al. | 326/83 |

\* cited by examiner

*Primary Examiner* — Daniel D Chang
(74) *Attorney, Agent, or Firm* — Harness, Dickey & Pierce, P.L.C.

(57) ABSTRACT

The present disclosure discloses an output buffer, a gate electrode driving circuit and a method for controlling the same. The output buffer includes a first transistor, a second transistor and an input signal control unit. The input signal control unit controls an input signal to obtain a pull-up signal and a pull-down signal, which are input to input terminals of the first transistor and the second transistor, respectively. The above output buffer uses the input signal control unit to divide one input signal into two signals, i.e., the pull-up signal and the pull-down signal.

11 Claims, 6 Drawing Sheets

PRIOR ART

Fig. 1

PRIOR ART

OUTPUT BUFFER, GATE ELECTRODE DRIVING CIRCUIT AND METHOD FOR CONTROLLING THE SAME

CROSS-REFERENCE TO RELATED APPLICATION

This application claims priority to Chinese Patent Application No. 201410158958.3 filed on Apr. 18, 2014, the disclosures of which are incorporated in their entirety by reference herein.

TECHNICAL FIELD

The present disclosure relates to the field of liquid crystal display, and more particularly to an output buffer, a gate electrode driving circuit and a method for controlling the same.

BACKGROUND

In digital integrated circuits, buffers are generally divided into two kinds including input buffers and output buffers. One input buffer temporarily stores data sent from peripherals, so as to facilitate a processor removing the data; and one output buffer is used to temporarily store data sent from the processor to the peripherals.

Figure 1:
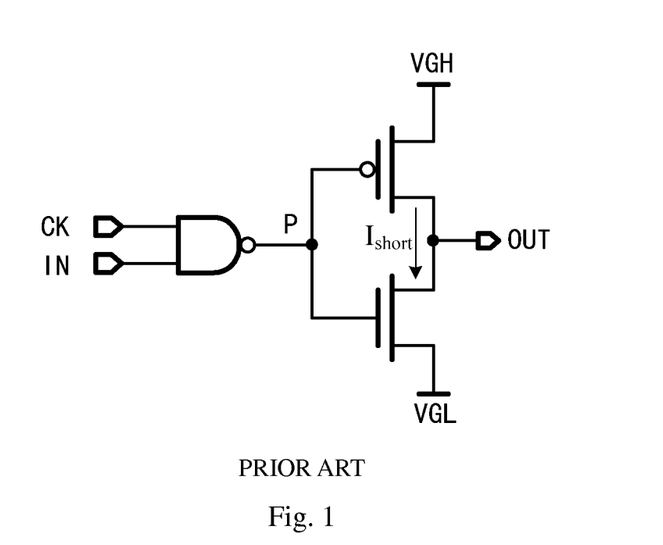
FIG. 1 is a schematic diagram showing a structure of an output buffer in a related art.

A schematic connection diagram of a currently commonly used output buffer is shown in FIG. 1. A CMOS buffer is composed of an even number of inverters, and a size of a device in each stage is enlarged to improve a driving load capacity of the buffer. After input signals IN and CK pass through a two-input NAND gate, an output P of the two-input NAND gate is taken as an input of the output buffer. The output buffer includes two transistors including a first transistor and a second transistor. The first transistor is a PMOS transistor and is taken as a pull-up transistor. The second transistor is an NMOS transistor and is taken as a pull-down transistor. When a voltage at the point P which is the input of the output buffer is at a high level, the NMOS is turned on and an output voltage OUT is at a low level. When the voltage at the point P which is the input of the output buffer is at the low level, the PMOS is turned on and the output voltage OUT is at the high level.

However, the above CMOS buffer circuit has its own shortcomings: when the input transits from the low level to the high level or from the high level to the low level, the PMOS and the NMOS are simultaneously turned on in a short period of time, at this time, a current is generated from the high level to the low level, resulting in a short-circuit current consumption. A size of the short-circuit current consumption is proportional to the current, a conducting time, a power supply voltage and an input switching frequency. A size of a conduction current in each device is related to sizes of the PMOS and the NMOS. Particularly as an output buffer, each of the pull-up transistor PMOS and the pull-down transistor NMOS has a large width to length ratio, so as to better drive a large load and have a higher fan out capability. However, when each device has a large width to length ratio, the conduction current also becomes large, resulting in that the corresponding short-circuit current consumption becomes large and accounts for a larger proportion of an overall power consumption.

SUMMARY

One technical problem to be solved by the present disclosure is how to reduce short-circuit current consumption of an output buffer.

In order to solve the above technical problem, the present disclosure provides an output buffer, which includes a first transistor, a second transistor and an input signal control unit; wherein the input signal control unit controls an input signal to obtain a pull-up signal and a pull-down signal which are input to input terminals of the first transistor and the second transistor, respectively.

Further, input terminals of the input signal control unit comprises an input terminal of an input signal and input terminals of at least two control signals.

Further, the input signal control unit further comprises at least two NAND gates; at least one control signal and the input signal are input to input terminals of the NAND gates; output terminals of the NAND gates output the pull-up signal of the input terminal of the first transistor and the pull-down signal of the input terminal of the second transistor, respectively.

Further, the input signal control unit comprises input terminals of two control signals comprising a first control signal and a second control signal, as well as two NAND gates comprising a first NAND gate and a second NAND gate; each of the first NAND gate and the second NAND gate is a two-input NAND gate; the first control signal is input to an input terminal of the first NAND gate; the second control signal is input to an input terminal of the second NAND gate; the input signal is input to another input terminal of the first NAND gate and another input terminal of the second NAND gate at the same time.

Further, the first transistor is a PMOS transistor; the second transistor is an NMOS transistor.

In order to solve the above technical problem, the present disclosure also provides a gate electrode driving circuit, which includes the above output buffer and an input signal generation unit; wherein the input signal generation unit is configured to generate an input signal for the output buffer; an output terminal of the output buffer outputs a gate electrode signal.

Further, the input signal generation unit comprises a generation module; a clock signal and an input starting signal are input to input terminals of the generation module; under control of the clock signal, the generation module realizes latch and shift, and generates the input signal which is output by an output terminal of the generation module.

Further, the generation module includes two inverters and two tri-state gates.

Further, the two inverters are a first inverter and a second inverter and the two tri-state gates are a first tri-state gate and a second tri-state gate, the clock signal is input to an input terminal of the first inverter, a third terminal of the first tri-state gate and a second terminal of the second tri-state gate; an output terminal of the first inverter is coupled to a second terminal of the first tri-state gate and a third terminal of the second tri-state gate; the input starting signal is input to a first terminal of the first tri-state gate; a fourth terminal of the first tri-state gate is coupled to a fourth terminal of the second tri-state gate and an input terminal of the second inverter; a first terminal of the second tri-state gate is coupled to an output terminal of the second inverter, and is taken as the output terminal of the generation module to provide the input signal for the output buffer.

In order to solve the above technical problem, the present disclosure also provides a method for controlling the above gate electrode driving circuit, which includes:

generating an input signal according to a clock signal and an input starting signal;

dividing the input signal into at least two branches of input signals, and generating a pull-up signal and a pull-down signal under control of at least two control signals; the pull-up signal and the pull-down signal being input to input terminals of a first transistor and a second transistor, respectively; and taking an output of the first transistor and the second transistor as a gate electrode signal.

Further, the input signal is divided into two branches of input signals: one branch of input signal is input to a first NAND gate, and is used to generate the pull-up signal under control of one of the at least two control signals; the other branch of input signal is input to a second NAND gate, and is used to generate the pull-down signal under control of another of the at least two control signals.

Further, when the pull-down signal changes from a high level to a low level, the second transistor changes from on to off; at this time, the pull-up signal is at the high level all the time, and the first transistor is in an off state all the time;

when the pull-down signal changes from the low level to the high level, the second transistor changes from off to on; at this time, the pull-up signal is at the high level all the time, and the first transistor is in the off state all the time;

when the pull-up signal changes from the high level to the low level, the first transistor changes from off to on; at this time, the pull-down signal is at the low level all the time, and the second transistor is in the off state all the time;

when the pull-up signal changes from the low level to the high level, the first transistor changes from on to off; at this time, the pull-down signal is at the low level all the time, and the second transistor is in the off state all the time.

Embodiments of the present disclosure provide an output buffer, a gate driving circuit and a method for controlling the same. The output buffer includes a first transistor, a second transistor and an input signal control unit. The input signal control unit controls an input signal to obtain a pull-up signal and a pull-down signal which are input to input terminals of the first transistor and the second transistor, respectively. The above output buffer uses the input signal control unit to divide one input signal into two signals, i.e., the pull-up signal and the pull-down signal. Since the two signals are respectively used to control the two transistors including the first transistor and the second transistor, this can make the two transistors not simultaneously turn on. Particularly as a buffer, in order to increase fan out capability of a shift register; the buffer has a large width to length ratio so that conduction current is large. By adopting the output buffer in the embodiment, there is no direct current path directly from the high level to the low level, and this can greatly reduce short-circuit current consumption of the buffer, thereby reducing consumption of the liquid crystal panel.

DETAILED DESCRIPTION

Specific implementation of the present invention will be described hereinafter in conjunction with the drawings and embodiments. The following embodiments are used to illustrate the present invention, but shall not be used to limit the scope of the present invention.

Figure 2:
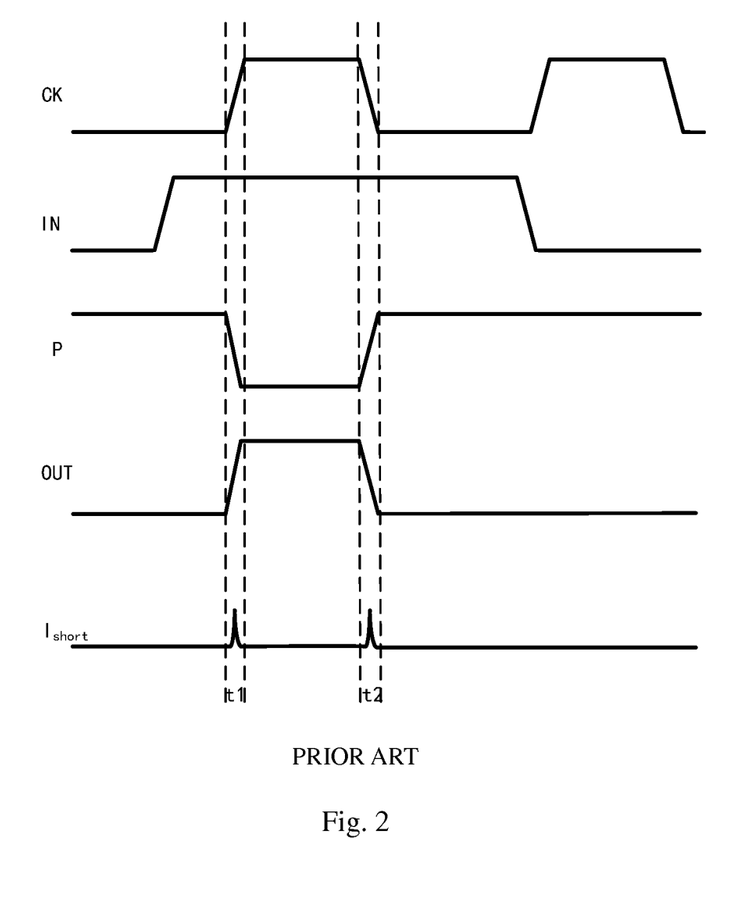
FIG. 2 is a waveform time sequence diagram of the output buffer in operation in the related art.

A driver for a liquid crystal display (LCD) panel, which is obtained by applying the buffer shown in FIG. 1 to a Low Temperature Poly-silicon (LTPS) technology, is usually integrated on the panel. There is a heavy load on scanning driving lines and data driving lines on the panel of high resolution. In order to drive the panel, it is usually needed to add an output buffer with a larger size to increase its output current. A waveform time sequence diagram of the output buffer of FIG. 1 in operation is shown in FIG. 2. In a time period t1, since one input terminal CK of two input terminals of the NAND gate transits from the low level to the high level and the other input terminal IN is at the high level, a level at the point P which is the output of the NAND gate transits from the high level to the low level in the time period t1. When the level at the point P is at the high level, the NMOS transistor is turned on; and when the level at the point P is at the low level, the PMOS transistor is turned on. During the process that the level at the point P transits from the high level to the low level, there is a moment that the PMOS transistor and the NMOS transistor are simultaneously turned on. At this moment, when a voltage at the point P has a voltage value between threshold voltages of the PMOS and NMOS, the NMOS and the PMOS are simultaneously turned on, thereby forming a direct current path between the PMOS transistor and the NMOS transistor from the high level to the low level, that is, a conduction current $I_{short}$ is generated, as shown in FIG. 2. It can be seen that one shock wave conduction current $I_{short}$ is generated in the time period t1; similarly, a same conduction current $I_{short}$ is also generated in a time period t2 (i.e., a time period when the CK transits from the high level to the low level). Because the shock wave conduction current has short-circuit current consumption which cannot be ignored, a power consumption caused by the current accounts for a larger proportion of an overall power consumption when each device has a large width to length ratio.

First Embodiment

Figure 3:
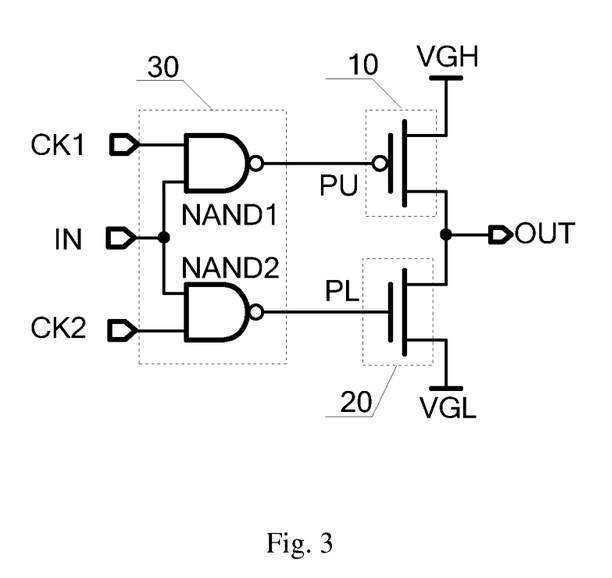
FIG. 3 is a schematic diagram showing a structure of an output buffer according to a first embodiment of the present disclosure.

A first embodiment of the present disclosure provides an output buffer. FIG. 3 is a schematic diagram showing the structure of the output buffer. The output buffer includes a first transistor 10, a second transistor 20 and an input signal control unit 30. The input signal control unit 30 controls an input signal IN to obtain a pull-up signal PU and a pull-down signal PL, which are input to input terminals of the first transistor 10 and the second transistor 20, respectively.

Optionally, the input signal control unit 30 of this embodiment includes one input signal IN and at least two control signals.

Optionally, the input signal control unit 30 of this embodiment further includes at least two NAND gates. Input terminals of the NAND gates are the control signals and at least one input signal IN; output terminals of the NAND gates are the pull-up signal PU of the input terminal of the first transistor 10 and the pull-down signal PL of the input terminal of the second transistor 20, respectively.

Optionally, the input signal control unit 30 of this embodiment includes two control signals including a first control signal CK1 and a second control signal CK2, as well as two NAND gates including a first NAND gate NAND1 and a second NAND gate NAND2. Each of the first NAND gate NAND1 and the second NAND gate NAND2 is a two-input NAND gate. The first control signal CK1 is input to an input terminal of the first NAND gate NAND1. The second control signal CK2 is input to an input terminal of the second NAND gate NAND2. The input signal IN is input to another input terminal of both of the first NAND gate NAND1 and the second NAND gate NAND2 at the same time.

This embodiment just takes two control signals and two two-input NAND gates as an example for illustration, and is not limited to two, for example, two three-input NAND gates and four control signals can also be used, and the input signal is still input to an input terminal of both of the two NAND gates at the same time, two control signals are input to another two input terminals of the NAND gate, respectively; of course, a multiple-input NAND gate can also be defined according to needs, the principle is similar and will not be repeated here.

Optionally, in this embodiment, the first transistor 10 is a PMOS transistor and the second transistor 20 is an NMOS transistor. The first transistor 10 is taken as a pull-up transistor; the PMOS transistor is usually used for loading and its gate-source threshold voltage is negative, and thus is turned on at the low level. On the contrary, the second transistor 20 is taken as a pull-down transistor; the NMOS transistor is usually used for driving and its gate-source threshold voltage is positive, and thus is turned on at the high level. In addition, a source electrode of the first transistor 10 is coupled to VGH; a drain electrode of the first transistor 10 and a drain electrode of the second transistor 20 together act as an output; a source electrode of the second transistor 20 is further coupled to VGL.

Figure 4:
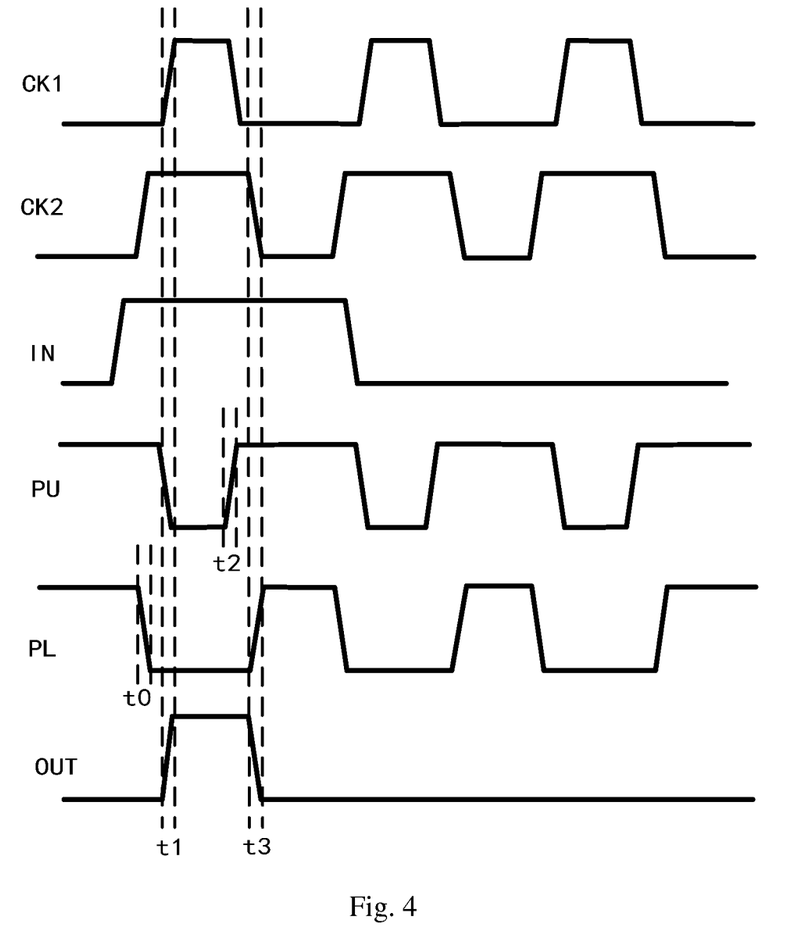
FIG. 4 is a waveform time sequence diagram of the output buffer in operation according to the first embodiment of the present disclosure.

Optionally, in this embodiment, FIG. 4 further shows a waveform time sequence diagram of the above output buffer provided with two control signals and two two-input NAND gates. It can be seen from FIG. 4, input terminals of the output buffer are divided into a pull-up signal PU input terminal and a pull-down signal PL input terminal; a period of time during which the PL is maintained at the low level every time after the PL transits from the high level to the low level is always longer than a period of time during which the PU is maintained at the low level after the PU transits from the high level to the low level. A time period t0 is a time period during which a voltage value of the PL transits from the high level to the low level; when the level is dropped to a certain value and a voltage value of the PU has not started to drop from the high level (i.e., before a time period t1), the NMOS changes from on to off; at this time, the voltage of PU is at high level, the PMOS is turned off, and there is no conduction pathway between power supplies. Until the time period t1, the voltage of PU transits from the high level to the low level and the PMOS is turned on, but the NMOS has turned off at this time, and thus there is also no conduction pathway between the power supplies. Similarly, in a time period t2, the voltage of PU changes to the high level, the PMOS is turned off, and the NMOS is still turned off. Only when reaching a time period t3, the voltage of the PL changes from the low level to the high level and the NMOS is turned on, but the PMOS has turned off at this time. It can be seen from the above analysis that the NMOS and the PMOS are not simultaneously turned on at any time, and the circuit also realizes pull-up and pull-down functions with a same output as that of FIG. 1.

Similarly, it is can also be seen, during a period of time between t0 and t1 or between t2 and t3, the PMOS and the NMOS can be simultaneously turned off, and the output is in a floating state; however, by reasonably matching waveforms of the input signals CK1 and CK2, a floating time thereof can be minimized.

The above output buffer uses the input signal control unit to divide one input signal into two signals, i.e., the pull-up signal and the pull-down signal; because the two signals are used to control the two transistor including the first transistor and the second transistor respectively, this can make the two transistors not simultaneously turn on. Particularly as one output buffer, in order to increase the fan out capability of the shift register, the buffer usually has a large width to length ratio so that conduction current is large. By adopting the output buffer of this embodiment, there is no direct current flow path formed between the supply voltages VGH and VGL, and thus short-circuit current consumption can be avoided.

Second Embodiment

Figure 5:
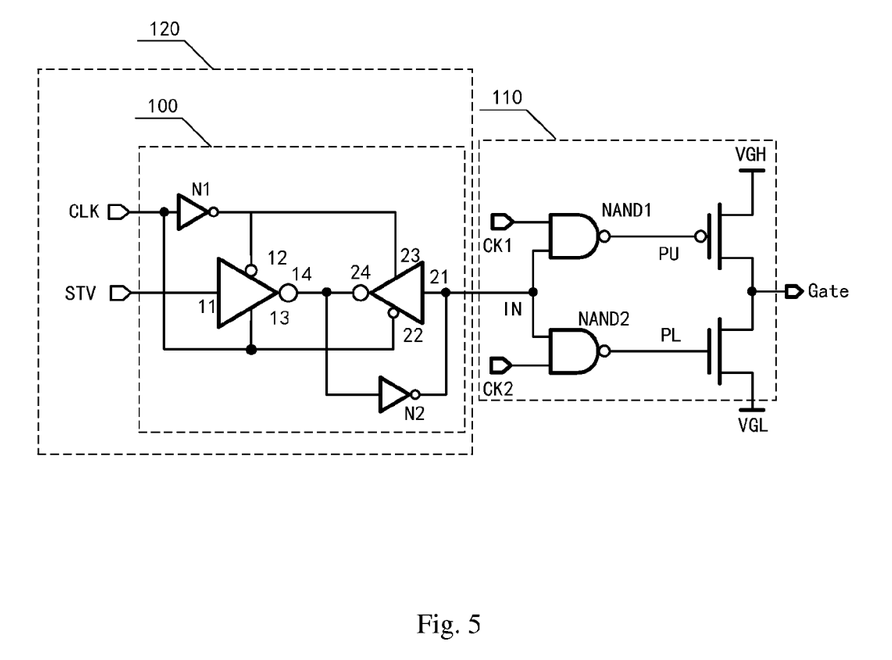
FIG. 5 is a schematic diagram showing a structure of a gate electrode driving circuit according to a second embodiment of the present disclosure.

Based on the above output buffer of the first embodiment, the second embodiment of the present disclosure also provides a gate electrode driving circuit, FIG. 5 is a schematic diagram showing the structure of the gate electrode driving circuit.

The gate driving circuit includes: an output buffer 110 and an input signal generation unit 120. The input signal generation unit 120 is configured to generate an input signal IN for the output buffer 110. An output terminal of the output buffer 110 outputs a gate electrode signal Gate.

Optionally, the input signal generation unit 120 includes a clock signal CLK, an input starting signal STV and a generation module 100. The clock signal CLK and the input stating signal STV are input to input terminals of the generation module 100. Under control of the clock signal CLK, the generation module 100 realizes latch and shift, and generates the input signal IN which is output by the output terminal of the generation module 100.

Optionally, the generation module 100 includes two inverters and two tri-state gates. The clock signal CLK is input to an input terminal of a first inverter N1, a third terminal 13 of a first tri-state gate and a second terminal 22 of a second tri-state gate. An output terminal of the first inverter N1 is coupled to a second terminal 12 of the first tri-state gate and a third terminal 23 of the second tri-state gate. The input starting signal STV is input to a first terminal 11 of the first tri-state gate. A fourth terminal 14 of the first tri-state gate is coupled to a fourth terminal 24 of the second tri-state gate and an input terminal of a second inverter N2. A first terminal 21 of the second tri-state gate is coupled to an output terminal of the second inverter N2, and is taken as the output terminal of the generation module 100 to provide the input signal IN for the output buffer 110.

Based on the foregoing, this embodiment also provides a method for controlling a gate driving circuit, the method includes:

generating an input signal IN according to a clock signal CLK and an input starting signal STV;

dividing the input signal IN into at least two branches of input signals, and generating a pull-up signal PU and a pull-down signal PU under control of at least two control signals; the pull-up signal PU and the pull-down signal PU being input to input terminals of a first transistor 10 and a second transistor 20, respectively;

taking an output of the first transistor 10 and the second transistor 20 as a gate electrode signal Gate.

The input signal IN is divided into two branches of input signals: one branch of input signal IN is taken as an input signal IN of the first NAND gate NAND1, and is used to generate the pull-up signal PU under control of the first control signal CK1; the other branch of input signal IN is taken as an input signal IN of the second NAND gate NAND2, and is used to generate the pull-down signal under control of the second control signal CK2.

Specifically, when the pull-down signal PL changes from the high level to the low level, the second transistor 20 changes from on to off; at this time, the pull-up signal PU is at the high level all the time, and the first transistor 10 is in an off state all the time;

when the pull-down signal PL changes from the low level to the high level, the second transistor 20 changes from off to on; at this time, the pull-up signal PU is at the high level all the time, and the first transistor 10 is in the off state all the time;

when the pull-up signal PU changes from the high level to the low level, the first transistor 10 changes from off to on; at this time, the pull-down signal PL is at the low level all the time, and the second transistor 20 is in the off state all the time;

when the pull-up signal PU changes from the low level to the high level, the first transistor 10 changes from on to off; at this time, the pull-down signal PL is at the low level all the time, and the second transistor 20 is in the off state all the time.

Figure 6:
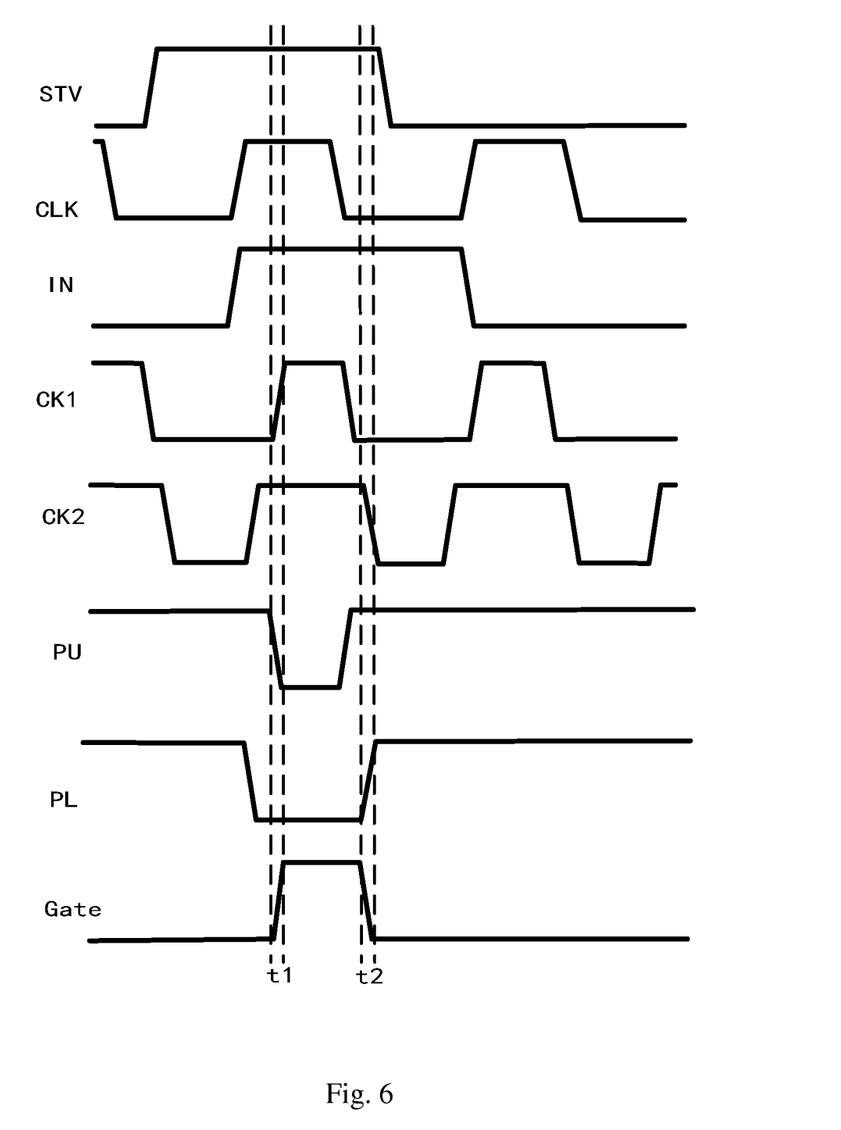
FIG. 6 is a waveform time sequence diagram of the gate electrode driving circuit in operation according to the second embodiment of the present disclosure.

STV is an input starting signal of a shift register, and is used to realize latch and shift functions under control of the clock signal CLK, and its input-and-output waveform relationship is shown by three pulses including STV, CLK and IN of FIG. 6. Under control of the CLK, the input signal IN shifts one half of a pulse width relative to the input starting signal STV. Under control of the CK1 and CK2, the input signal IN is divided into the pull-up signal PU and the pull-down signal PL by two two-input NAND gates. A pulse width of the output signal Gate is determined by a period of time between a rising transition of the CK1 and a falling transition of the CK2. When waveforms of the PU and PL signals are as shown in FIG. 6, the NMOS and the PMOS are not simultaneously turned on. Particularly as a buffer, in order to increase the fan out capability of the shift register, the buffer usually has a large width to length ratio, and the NMOS and the PMOS has a large conduction current, since there is no direct current path between supply voltages VGH and VGL, the short-circuit current consumption can be avoided.

Through the gate electrode driving circuit and the method for controlling the same provided in this embodiment, the input signal control unit divides one input signal into two signals, i.e., the pull-up signal and the pull-down signal; because the two signals are use to control the two transistors including the first transistor and the second transistor respectively, this can make the two transistors not simultaneously turn on. Particularly as one output buffer, in order to increase the fan out capability of the shift register, the buffer usually has a large width to length ratio so that conduction current is large. By adopting the output buffer of this embodiment, there is no direct current flow path formed between the supply voltages VGH and VGL, and thus short-circuit current consumption can be avoided.

The foregoing embodiments are merely used to illustrate the present invention, but shall not be used to limit the present invention. For those skilled in the art, some modifications and alterations may be made without departing from the basic concept and the scope of the present invention, and these should fall within the scope of the present invention. Thus, the protection scope of the present invention should be based on the claims.

What is claimed is:

1. An output buffer, comprising:
a first transistor, a second transistor and an input signal control unit; wherein the input signal control unit controls an input signal to obtain a pull-up signal and a pull-down signal, the pull-up signal and the pull-down signal are input to input terminals of the first transistor and the second transistor, respectively,
wherein input terminals of the input signal control unit comprises an input terminal of the input signal and input terminals of at least two control signals,
wherein the input signal control unit further comprises at least two NAND gates; at least one control signal and the input signal are input to input terminals of the NAND gates; output terminals of the NAND gates output the pull-up signal of the input terminal of the first transistor and the pull-down signal of the input terminal of the second transistor, respectively, and the output terminals of the NAND gates are directly connected to the input terminal of the first transistor and the input terminal of the second transistor,
wherein the at least two control signals are clock signals, the clock signals are designed so that time periods where the pull-up signal and the pull-down signal jump from a high level to a low level and from a low level to a high level are not overlapped to each other.

2. The output buffer according to claim 1, wherein the input signal control unit comprises input terminals of two control signals comprising a first control signal and a second control signal, as well as two NAND gates comprising a first NAND gate and a second NAND gate; each of the first NAND gate and the second NAND gate is a two-input NAND gate; the first control signal is input to an input terminal of the first NAND gate; the second control signal is input to an input terminal of the second NAND gate; the input signal is input to another input terminal of the first NAND gate and another input terminal of the second NAND gate at the same time.

3. The output buffer according to claim 2, wherein the first transistor is a PMOS transistor; the second transistor is an NMOS transistor.

4. The output buffer according to claim 1, wherein the first transistor is a PMOS transistor; the second transistor is an NMOS transistor.

5. A gate electrode driving circuit comprising an output buffer and an input signal generation unit; wherein the input signal generation unit is configured to generate an input signal for the output buffer; an output terminal of the output buffer outputs a gate electrode signal,
wherein the output buffer comprises a first transistor, a second transistor and an input signal control unit; wherein the input signal control unit controls an input signal to obtain a pull-up signal and a pull-down signal, the pull-up signal and the pull-down signal are input to input terminals of the first transistor and the second transistor, respectively; input terminals of the input signal control unit comprises an input terminal of the input signal and input terminals of at least two control signals; wherein the input signal control unit further comprises at least two NAND gates; at least one control signal and the input signal are input to input terminals of the NAND gates; output terminals of the NAND gates output the pull-up signal of the input terminal of the first transistor and the pull-down signal of the input terminal of the second transistor, respectively, and the output terminals of the NAND gates are directly connected to the input terminal of the first transistor and the input terminal of the second transistor, wherein the at least two control signals are clock signals, the clock signals is designed so that time periods where the pull-up signal and the pull-down signal jump from a high level to a low level and from a low level to a high level are not overlapped to each other.

6. The gate electrode driving circuit according to claim 5, wherein the input signal generation unit comprises a generation module; a clock signal and an input starting signal are input to input terminals of the generation module; under control of the clock signal, the generation module realizes latch and shift, and generates the input signal which is output by an output terminal of the generation module.

7. The gate electrode driving circuit according to claim 6, wherein the generation module comprises two inverters and two tri-state gates.

8. The gate electrode driving circuit according to claim 7, wherein the two inverters are a first inverter and a second inverter and the two tri-state gates are a first tri-state gate and a second tri-state gate, the clock signal is input to an input terminal of the first inverter, a third terminal of the first tri-state gate and a second terminal of the second tri-state gate; an output terminal of the first inverter is coupled to a second terminal of the first tri-state gate and a third terminal of the second tri-state gate; the input starting signal is input to a first terminal of the first tri-state gate; a fourth terminal of the first tri-state gate is coupled to a fourth terminal of the second tri-state gate and an input terminal of the second inverter; a first terminal of the second tri-state gate is coupled to an output terminal of the second inverter, and is taken as the output terminal of the generation module to provide the input signal for the output buffer.

9. A gate electrode driving circuit comprising an output buffer and an input signal generation unit; wherein the input signal generation unit is configured to generate an input signal for the output buffer; an output terminal of the output buffer outputs a gate electrode signal, wherein the output buffer comprises a first transistor, a second transistor and an input signal control unit; wherein the input signal control unit controls an input signal to obtain a pull-up signal and a pull-down signal, the pull-up signal and the pull-down signal are input to input terminals of the first transistor and the second transistor, respectively; input terminals of the input signal control unit comprises an input terminal of the input signal and input terminals of at least two control signals; wherein the input signal control unit further comprises at least two NAND gates; at least one control signal and the input signal are input to input terminals of the NAND gates; output terminals of the NAND gates output the pull-up signal of the input terminal of the first transistor and the pull-down signal of the input terminal of the second transistor, respectively, and the output terminals of the NAND gates are directly connected to the input terminal of the first transistor and the input terminal of the second transistor, wherein the input signal generation unit comprises a generation module; a clock signal and an input starting signal are input to input terminals of the generation module; under control of the clock signal, the generation module realizes latch and shift, and generates the input signal which is output by an output terminal of the generation module.

10. The gate electrode driving circuit according to claim 9, wherein the generation module comprises two inverters and two tri-state gates.

11. The gate electrode driving circuit according to claim 10, wherein the two inverters are a first inverter and a second inverter and the two tri-state gates are a first tri-state gate and a second tri-state gate, the clock signal is input to an input terminal of the first inverter, a third terminal of the first tri-state gate and a second terminal of the second tri-state gate; an output terminal of the first inverter is coupled to a second terminal of the first tri-state gate and a third terminal of the second tri-state gate; the input starting signal is input to a first terminal of the first tri-state gate; a fourth terminal of the first tri-state gate is coupled to a fourth terminal of the second tri-state gate and an input terminal of the second inverter; a first terminal of the second tri-state gate is coupled to an output terminal of the second inverter, and is taken as the output terminal of the generation module to provide the input signal for the output buffer.

* * * * *